United States Patent Office 3,102,084

Patented Aug. 27, 1963

3,102,084

JET PLATING METHOD OF MANUFACTURE OF MICRO-ALLOY SEMICONDUCTOR DEVICES

Thomas J. Manns, Glenside, Pa., assignor, by mesne assignments, to Philco Corporation, Philadelphia, Pa., a corporation of Delaware No Drawing. Filed July 8, 1960, Ser. No. 41,497
4 Claims. (Cl. 204—15)

This invention relates to the jet plating process of manufacture of micro-alloy semiconductor devices, such as transistors, in the course of which at least one diode junction is formed; for example in the case of a transistor diode junctions are formed at the emitter and collector elements. This invention relates more particularly to micro-alloy semiconductor devices employing cadmium electrodes, and it is concerned with the preservation of the diodes in such devices, as hereinafter described.

For the present purpose, by way of example it will suffice to refer generally to the jet plating process of manufacture of micro-alloy transistors. For a detailed description thereof reference may be had to a copending application of R. A. Williams, Serial No. 669,852, filed July 3, 1957, assigned to the assignee of the present application and now abandoned.

In the customary manufacture of micro-alloy transistors, a semiconductor wafer is jet etched to form opposed depressions or recesses therein so as to provide a thin base portion having relatively flat opposed surfaces in said recesses, and the electrode metal is jet plated onto said surfaces and is subsequently micro-alloyed with the semiconductor wafer. The unit is later baked to drive off occluded gases and undesirable solvent materials.

For example, in the manufacture of certain micro-alloy transistors, small dots of the electrode metal are formed on such surfaces of a germanium wafer which has a resistivity gradient within the thin base portion between regions of relatively low and relatively high resistivity. Diode junctions are formed at the dots.

In a copending application of G. L. Schnable, Serial No. 829,436, filed July 24, 1959, now Patent No. 3,005,735, assigned to the assignee of the present application, there is disclosed and claimed a micro-alloy transistor employing cadmium as the electrode metal. As set forth in that application, the use of cadmium is advantageous, particularly because it has much better thermal properties than previously-used metals such as indium, and it can be subjected to higher temperatures without melting.

However, the use of a cadmium plating solution in the jet plating process gave rise to problems in respect to the aforementioned diode junctions. One problem has to do with the measurement of diode breakdown voltages immediately following the jet plating operation. It was found that after the unit was rinsed and dried the diode breakdown voltages would drop rapidly due to exposure of the plated metal to air. That problem was solved by the invention disclosed and claimed in the copending application of G. L. Schnable and J. Javes, Serial No. 33,940, filed June 6, 1960, now Patent No. 3,034,970, assigned to the assignee of the present application. According to that invention, a small quantity or trace of a metal, selected from the group comprising silver, rhodium, gold, palladium and platinum, is added to the cadmium plating solution.

A second problem which was not solved by the Schnable and Javes invention, is that during the aforementioned baking the diode junctions tend to degrade and this tends adversely to affect the finished device. In production, this substantially reduces the production yield. Furthermore the diodes also tend to degrade if the finished device is operated at higher than normal temperatures.

The principal object of the present invention is to provide a solution of this second problem.

I have discovered that if a predetermined small quantity or trace of copper is added to the cadmium plating solution, it effectively prevents degradation of the diodes during baking and thereafter, without adversely affecting the device. The copper may be added by adding to the plating solution a predetermined amount of a copper salt solution, such as copper sulfate, copper nitrate, or copper fluoborate. Alternatively, there may be added to the plating solution a copper compound which produces a soluble salt in the solution.

It is not definitely known why the copper produces the stated result. However, it is thought that copper is electro-deposited with the cadmium, and that this somehow counteracts the diode degradation which otherwise would occur during baking and during operation at high temperatures.

A plating solution in accordance with this invention may be prepared by the addition of a prepared copper salt solution in the course of preparation of the cadmium plating solution. By way of example, a suitable copper sulfate solution may be prepared as follows:

Dissolve 3.93 grams of A.C.S. reagent grade cupric sulfate pentahydrate ($CuSo_4.5H_2O$) in deionized water to form 1 liter of solution which will contain 1 mg. of copper per ml. Dissolve by agitating the container. Measure out 100 ml. of this solution and dilute it to 1 liter with deionized water. Mix by agitation as before. The resulting solution contains 0.1 mg. of copper per ml. of solution. This is the prepared copper salt solution to be added to the cadmium plating solution as hereinafter described.

The amount of the prepared copper sulfate solution to be added to the cadmium plating solution during preparation of the latter naturally depends on the desired copper concentration. Expressing the copper concentration in p.p.m. (parts of copper per million parts of plating solution), the preferred range of copper concentration is from 0.02 p.p.m. to 0.05 p.p.m., although the copper concentration may vary from 0.001 p.p.m. to 0.1 p.p.m. or higher but should be below 1 p.p.m.

For a given number of liters of plating solution, the amount of the prepared copper sulfate solution required for the desired copper concentration is the product of said concentration, the number of liters of plating solution and the factor 10. For example, for 18 liters of plating solution and a desired copper concentration of 0.02 p.p.m., the required amount of copper sulfate solution is $$0.02 \times 18 \times 10 = 3.6 \text{ ml.}$$

The cadmium plating solution may be prepared from a cadmium fluoborate solution containing 40 to 60 percent by weight of pure cadmium fluoborate, i.e. cadmium fluoborate in which any trace metal present is of relatively insignificant concentration. In 18 liters of plating solution there may be 137.3 grams of pure cadmium fluoroborate. Assuming that the cadmium fluoborate solution to be employed has a concentration of about 49 percent, 280 grams of the solution may be used in the preparation of 18 liters of plating solution.

The plating solution may be prepared as follows. Add about 16 liters of deionized water to a 5-gallon polyethylene carboy calibrated to 18 liters. The amount of cadmium fluoborate solution required is determined by $$\frac{137.3}{0.49} = 280$$

grams. Add this amount to the carboy. Mix thoroughly by bubbling nitrogen through the solution for 10 minutes at a rate sufficient for good mixing. Add the required amount of copper salt solution. Dilute the solution to 18 liters with deionized water. Bubble nitrogen through the solution for at least 10 minutes to mix the solution thoroughly as before. Determine the pH of the solution by means of a pH meter which has been standardized against a buffer solution having a pH of 2.00. Measure the temperature to the nearest degree centigrade and adjust the pH meter accordingly. The acceptable pH range is 2.3 to 2.4. If the pH of the solution is too high, fluoboric acid should be added in small increments. After each addition of fluoboric acid, the solution should be mixed by bubbling with nitrogen for at least 10 minutes before another pH reading is taken.

Just before the plating solution is to be used, 2.5 ml. of a 15% solution of decylbenzene sodium sulfonate (or the equivalent quantity of a similar surface active agent of the alkyl aryl sodium sulfonate type) should be added to the 18-liter batch of plating solution, and nitrogen should be bubbled gently through the solution for 5 minutes to mix it.

As previously stated, the preferred range of copper concentrations employed according to this invention is 0.02 p.p.m. to 0.05 p.p.m. In the manufacture of so-called MAT transistors a copper concentration of 0.02 p.p.m. has been found to be desirable, whereas in manufacture of so-called MADT transistors a copper concentration of 0.05 p.p.m. has been found to be desirable.

In conducting the jet plating with a cadmium plating solution having a copper additive according to this invention, the preferred range of plating current density is 9 to 12 microamperes per circular mil of jet orifice (the number of circular mils is the diameter of the jet orifice expersssed in mils squared). Jet to blank spacing is $\frac{1}{10}$ inch. With a current of 200 microamperes, a 4.2 mil jet giving a current density of 11 microamperes per circular mil, and a seven second plating time, a plating diameter of about 8 mils is obtained. A flow rate of about 8 ml./min. is used.

While the invention has been described with particular reference to the preferred embodiment, it will be understood that the invention is not limited thereto but contemplates such other embodimens as may be utilized.

I claim:

1. In the manufacture of micro-alloy semiconductor devices involving jet plating of at least one cadmium element onto a semiconductor blank and also involving application of heat to form at least one diode junction which tends to be degraded by later baking or operation at high temperatures, the improvement which consists in conducting said jet plating with a cadmium plating solution containing in solution a predetermined small quantity of copper effective substantially to prevent degradation of the diode junction.

2. The method according to claim 1 wherein the cadmium plating solution contains a quantity of copper of at least 0.001 but less than 1.0 part of copper per million parts of plating solution.

3. The method according to claim 1 wherein the cadmium plating solution contains a quantity of copper within the range 0.02 to 0.05 part of copper per million parts of plating solution.

4. In the manufacture of micro-alloy semiconductor devices involving jet plating of at least one cadmium element onto a semiconductor blank and also involving application of heat to form at least one diode junction which tends to be degraded by later baking or operation at high temperatures, the improvement which consists in conducting said jet plating with a cadmium plating solution to which has been added a quantity of soluble copper salt such that the plating solution contains a predetermined small quantity of copper effective substantially to prevent degradation of the diode junction.

References Cited in the file of this patent

UNITED STATES PATENTS

| | | |
|---|---|---|
| 1,681,509 | Westbrook | Aug. 21, 1928 |
| 2,846,346 | Bradley | Aug. 5, 1958 |
| 2,885,571 | Williams et al. | May 5, 1959 |
| 2,930,949 | Roschen | Mar. 29, 1960 |